(12) United States Patent
Mui et al.

(10) Patent No.: US 6,235,643 B1
(45) Date of Patent: May 22, 2001

(54) METHOD FOR ETCHING A TRENCH HAVING ROUNDED TOP AND BOTTOM CORNERS IN A SILICON SUBSTRATE

(75) Inventors: David Mui, Santa Clara; Dragan Podlesnik, Palo Alto; Wei Liu, Sunnyvale; Gene Lee, San Jose; Nam-Hun Kim, Cupertino; Jeff Chinn, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/371,966

(22) Filed: Aug. 10, 1999

(51) Int. Cl.[7] ................................................. H01L 21/00
(52) U.S. Cl. ........................ 438/719; 156/345; 438/724; 438/725; 438/738
(58) Field of Search ..................................... 438/719, 723, 438/724, 725, 737, 738, 739–743, 744; 156/345 P; 216/2, 67, 72, 79

(56) References Cited

U.S. PATENT DOCUMENTS

| | | | |
|---|---|---|---|
| 4,693,781 | * 9/1987 | Leung et al. | 438/705 X |
| 4,729,815 | * 3/1988 | Leung | 438/719 X |
| 4,857,477 | * 8/1989 | Kanamori | 438/719 X |
| 5,843,846 | 12/1998 | Nguyen et al. | 438/713 |
| 6,103,635 | * 8/2000 | Chau et al. | 438/739 |

OTHER PUBLICATIONS

U.S. Patent Application Ser. Num. 09/042,146, of Diana Ma, filed Mar. 13, 1998.

* cited by examiner

*Primary Examiner*—William Powell
(74) *Attorney, Agent, or Firm*—Shirley L. Church

(57) ABSTRACT

The present invention provides straight forward methods for plasma etching a trench having rounded top corners, or rounded bottom corners, or both in a silicon substrate. A first method for creating a rounded top corner on the etched silicon trench comprises etching both an overlying silicon oxide layer and an upper portion of the silicon substrate during a "break-through" step which immediately precedes the step in which the silicon trench is etched. The plasma feed gas for the break-through step comprises carbon and fluorine. In this method, the photoresist layer used to pattern the etch stack is preferably not removed prior to the break-through etching step. Subsequent to the break-through step, a trench is etched to a desired depth in the silicon substrate using a different plasma feed gas composition. A second method for creating a rounded top corner on the etched silicon trench comprises formation of a built-up extension on the sidewall of an overlying patterned silicon nitride hard mask during etch (break-through) of a silicon oxide adhesion layer which lies between the hard mask and a silicone substrate. The built-up extension upon the silicon nitride sidewall acts as a sacrificial masking material during etch of the silicon trench, delaying etching of the silicon at the outer edges of the top of the trench. This permits completion of trench etching with delayed etching of the top corner of the trench and provides a more gentle rounding (increased radius) at the top corners of the trench. During the etching of the silicon trench to its final dimensions, it is desirable to round the bottom corners of the finished silicon trench. We have discovered that a more rounded bottom trench corner is obtained using a two-step silicon etch process where the second step of the process is carried out at a higher process chamber pressure than the first step.

32 Claims, 8 Drawing Sheets

METHOD FOR ETCHING A TRENCH HAVING ROUNDED TOP AND BOTTOM CORNERS IN A SILICON SUBSTRATE

BACKGROUND OF THE INVENTION

1. Field of the Invention

The present invention pertains to a method for etching a trench in a silicon substrate. In particular, the present invention pertains to particular plasma etch chemistries and process conditions which may be used to produce a rounded top trench corner, a rounded bottom trench corner, or both.

2. Brief Description of the Background Art

Trenches formed in silicon using traditional etching methods typically have sharp, squared-off top corners. These sharp, squared-off corners lead to high field stress in film layers subsequently deposited thereon during further processing steps. The high field stress can potentially lead to the electrical breakdown of the overlying deposited film layers. Further, the sharp, squared-off corners are a point of charge accumulation, which can cause edge leakage. Rounding of the top corners in trench structures can be critical for device performance. However, rounding of the corners in a manner which results in a loss of device active area is undesirable.

Various methods for obtaining a rounded top corner on a trench formed in a silicon substrate are known in the art. For example, U.S. Pat. No. 5,843,846, issued Dec. 1, 1998 to Nguyen et al., discloses a method for rounding the top corners of a sub-micron trench in a semiconductor device after trench formation. The method comprises exposing the previously formed trench to a gas comprising a carbon-fluorine gas, argon, and nitrogen directly after trench formation. The combination of the carbon-fluorine and nitrogen gases etch back the silicon nitride and stress relief oxide layers in order to expose the top corners of the trench. As the top corners of the substrate are exposed, nitrogen and argon gases are said to sputter the top corners, rounding them as the etch process completes the trench. The method is preferably performed using a low density parallel plate etch reactor.

Commonly assigned, copending U.S. application Ser. No. 09/042,249, filed Mar. 13, 1998, discloses a method of obtaining a rounded top corner on a trench formed in a semiconductor substrate comprising the following steps: (a) providing a film stack comprising the following layers, from the upper surface of the film stack toward the underlying substrate, (I) a first layer of patterned material (typically, a patterned photoresist) which is resistant to a wet etch solution used to etch an underlying second layer and which is resistant to dry etch components used to etch the semiconductor substrate (typically, silicon), and (ii) a second layer of material (typically, silicon dioxide) which can be preferentially etched using a wet etch solution, wherein the second layer of material is deposited directly on top of the semiconductor substrate; (b) wet etching the second layer by immersing the film stack in a wet etch solution for a period of time sufficient to form an undercut beneath the first layer and to expose the underlying semiconductor substrate; and isotropically dry etching the exposed semi conductor substrate so as to form a trench in the semiconductor substrate.

A sharp corner at the bottom of a trench can also be a source stress, causing problems of the kind described with reference to the top corners of the trench. In addition, a rounded corner facilitates filling of the trench with a reduced possibility of trapping voids within the fill material. It is desirable to provide an etch process which provides a rounded bottom corner while maintaining a desired trench sidewall angle, for example about 80° to 90°.

SUMMARY OF THE INVENTION

We have discovered two methods for creating a rounded top corner on a trench etched in a silicon substrate. We have also discovered a straight forward bottom corner rounding method which may be used in combination with either of the top corner rounding methods.

A typical etch stack for etching a silicon trench comprises, from top to bottom: a patterned photoresist layer, a layer of silicon nitride, and a layer of silicon oxide (which are deposited upon the silicon substrate into which the trench is to be etched).

A first method for creating a rounded top corner on the etched silicon trench comprises etching both the silicon oxide layer and an upper portion of the underlying silicon substrate during a "break-through" step which immediately precedes the step in which the silicon trench is etched. The break-through step is used for removal of the silicon oxide layer overlying silicon substrate areas in which a trench is to be etched. The plasma feed gas for the break-through step comprises carbon and fluorine. The atomic ratio of fluorine to bromine in the plasma feed gas is preferably within the range of about 10:1 to about 50:1.

In this method, the photoresist layer is preferably not removed prior to the break-through etching step. Subsequent to the break-through step, a trench is etched to a desired depth in the silicon substrate using a different plasma feed gas composition. Both the silicon oxide etch and silicon trench etch may be performed in a single processing chamber, reducing processing time, providing increased throughput, and providing a decrease in processing costs. In some instances, other etch stack layers, such as the photoresist layer and the silicon nitride layer, can be removed in the same process chamber, using a plasma which produces byproducts compatible with the plasmas used in subsequent device processing steps. The principal etchant of the break-through etch plasma is generated from a feed gas containing fluorine which may be, by way of example and not by way of limitation, selected from the group consisting of $CF_4$, $CHF_3$, $CH_2F_2$, $CH_3F$, and combinations thereof. The principal etchant is preferably selected from the group consisting of $CF_4$, $CHF_3$, and combinations thereof; and $CF_4$ has been shown to work very well. The plasma feed gas may further include $CH_4$. In some instances the presence of $CH_4$ may be required, for example, when the amount of photoresist material available during the silicon oxide layer etch is minimal. The plasma feed gas preferably further includes a nonreactive, diluent gas selected from the group consisting of argon, helium, xenon, krypton, and combinations thereof. The nonreactive, diluent gas is most preferably argon. The plasma feed gas may further include a controlled amount of oxygen, which may be used to improve the top corner rounding effect. The radius of the rounded corner depends on the feature size of the structure being etched. For a feature size of about 0.35 $\mu$m, a typical radius for a rounded top corner ranges from about 15 nm to about 25 nm.

A second method for creating a rounded top corner on the etched silicon trench comprises formation of a built-up extension on the sidewall of the patterned silicon nitride layer during etch (break-through) of the underlying silicon oxide adhesion layer. The built-up extension upon the silicon nitride sidewall acts as a sacrificial masking material during etch of the silicon trench, delaying etching of the silicon at the outer edges of the top of the trench. This permits completion of trench etching with delayed etching of the top corner of the trench and provides a more gentle rounding (increased radius) at the top corners of the trench. For example, for a feature size of about 0.16µ, a typical radius for a rounded top corner ranges from about 25 nm to about 40 nm.

In this second method for creating a rounded top corner, the photoresist used to pattern the silicon nitride hard mask is removed prior to the silicon oxide break-through step. The plasma feed gas used during the break-through step must provide a source of hydrogen, a source of fluorine, a source of carbon, and a source of surface bombardment atoms. Typically the surface bombardment atom source is an inert plasma feed gas such as argon, helium, krypton, nitrogen, xenon, or a combination thereof. Argon works particularly well. A single compound may be used to provide the hydrogen, carbon, and fluorine. Typically more than one gaseous compound is used. It is important to have a controlled amount of carbon present in the process chamber at the time of the break-through step. While the hydrogen and the carbon are used to form polymeric material which deposits upon the silicon nitride sidewall, the fluorine and the bombardment atoms (typically argon) provide for removal of native oxide layers. Examples of hydrogen sources other than hydrogen gas include HBr (which requires an increased amount of carbon in the process chamber to work well), $CHF_3$, $CH_2F_2$, $CH_3F$, $NH_3$, $CH_4$, and combinations thereof. Several of these hydrogen-containing compounds may also serve as carbon and fluorine sources. An excellent source of carbon and fluorine is $CF_4$. One of the plasma feed gas recipes which provides excellent results is a combination of $CF_4$, HBr, and argon.

During the etching of the silicon trench which follows the break-through step, it is desirable to round the bottom corners of the finished silicon trench. We have developed a method for rounding the bottom corners which may be used in combination with either of the top corner rounding methods described above. The plasma used to etch the silicon trench is one commonly used in the art and is different from that used for the top corner rounding methods. In some instances, the substrate may be removed from the processing chamber prior to the silicon etch, but preferably the silicon oxide etch and silicon trench etch are performed in sequence in a single processing chamber.

The trench is typically etched to a desired final depth in the silicon substrate using conventional silicon etch chemistry, where the plasma feed gas comprises chlorine, or oxygen, or a combination thereof. The plasma feed gas may include $SF_6$. We have discovered that a more rounded bottom trench corner is obtained using a two-step silicon etch process. In the first silicon etch step, the trench is etched to a depth within the range of about 75% and about 95%, most preferably, within the range of about 80% and 90%, of its desired final depth. The etch chamber pressure is within the range of about 15 mTorr and about 40 mTorr. Preferably the chamber pressure is about 20 to 30 mTorr. The etch plasma is a high density plasma having an electron density ranging from about $10^9$ to $10^{12}$ $e^-/cm^3$. In the second silicon etch step, the process chamber pressure is increased to range between about 40 mTorr and about 90 mTorr. Preferably the chamber pressure is about 50 to 60 mTorr. Optionally, $SF_6$ may be added to the silicon trench etch plasma feed gas to assist in the corner rounding process. For a feature size of about 0.16µ, a typical radius obtained for a rounded bottom corner ranges from about 15 nm to about 25 nm.

All three of the corner rounding steps described above are preferably performed in a processing apparatus which provides for separate power control of a plasma generation source and a substrate biasing device.

DETAILED DESCRIPTION OF THE INVENTION

Figure 1:
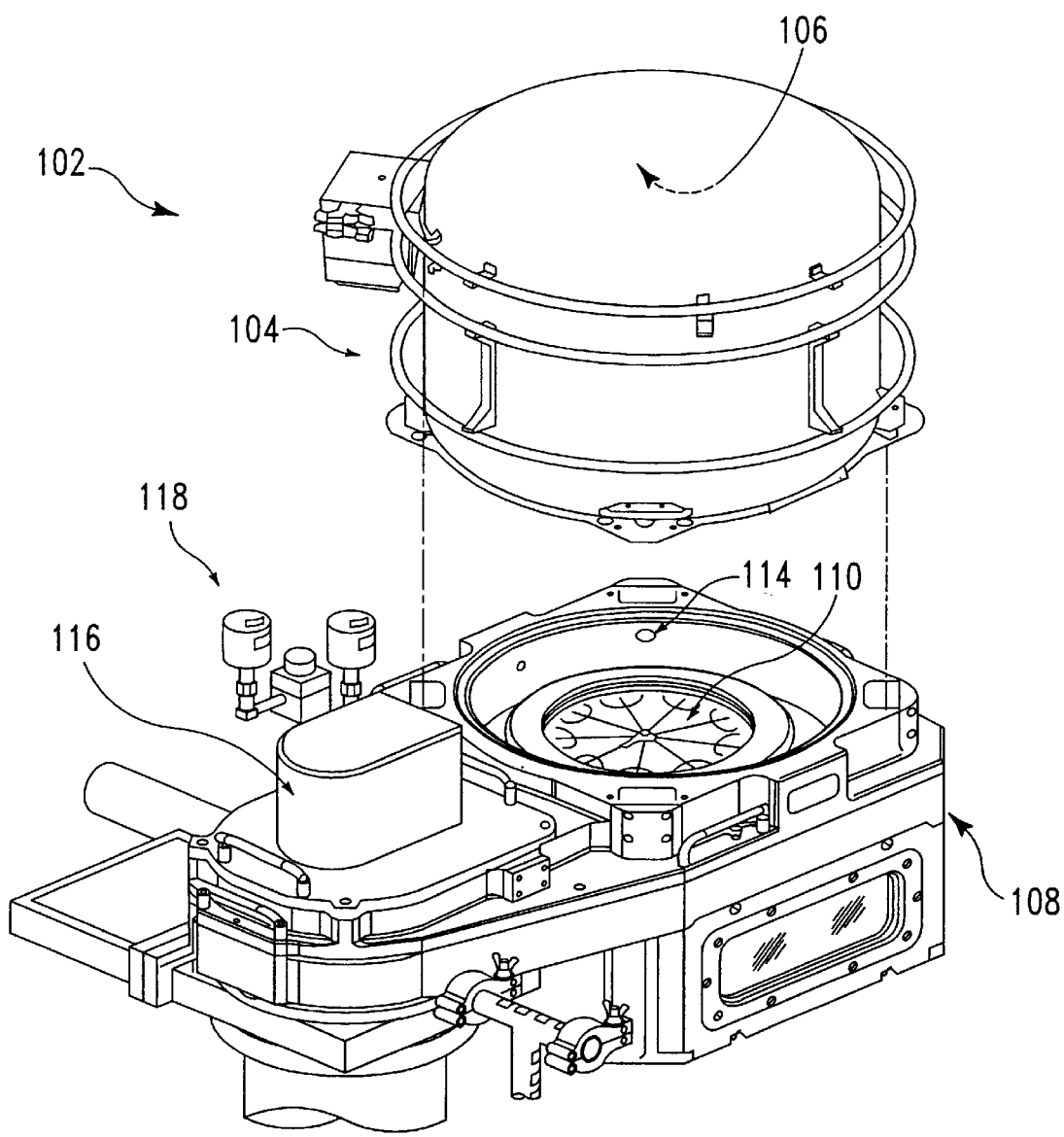
FIG. 1 is a schematic of an individual polysilicon etch chamber of the type used in an Applied Materials' CENTURA® DPS™ polysilicon etch system, which is an example of an etch processing apparatus which can be used for performing the method of the invention.

The present invention relates to corner rounding during the etching of silicon trenches. There are two methods for top corner rounding and a method for bottom corner rounding which can be used in combination with either top corner rounding method.

The typical etch stack used to form the shallow trench is, from top to bottom, a patterned photoresist, a layer of silicon nitride, and a layer of silicon oxide, all overlying a silicon substrate into which the trench is to be etched.

In the first top corner rounding method of the invention, the silicon substrate upper surface is pre-etched to form rounded upper trench corners during a break-through etch of the silicon oxide layer. The rounded top corners are obtained using a particular etch chemistry, polymeric material available from patterned photoresist residue remaining after etch of the silicon nitride hard mask, and the silicon oxide layer present between the silicon nitride hard mask and the silicon substrate.

In the second top corner rounding method of the invention, the photoresist residue present after etch of the silicon nitride hard mask is removed prior to application of the corner rounding method. The rounded top corners are obtained by constructing a built-up sacrificial structure on the side wall surfaces of the patterned silicon hard mask. The sacrificial structures are formed during the break-through etch of the silicon oxide layer. The rounded top corners on the silicon trench are formed subsequently, during etch of the silicon trench. The built-up sacrificial structure is formed from reactants added to the etch gas and from byproducts formed during etching of the silicon oxide adhesion layer itself.

In most applications, a trench having rounded bottom corners is desired. Rounded bottom corners are prepared using a two step silicon trench etch process. In the first silicon etch step, the trench is etched to a depth within the range of about 75% and about 95%, most preferably, within the range of about 80% and 90%, of its desired final depth using conventional silicon etch chemistry with a process chamber pressure within the range of about 15 mTorr and about 40 mTorr. In the second silicon etch step, the process chamber pressure is increased. The second step etch is carried out using the same etch chemistry, but at a process chamber pressure within the range of about 40 mTorr to about 90 mTorr. In addition to a higher process pressure, a high substrate bias (i.e., about −540 V to about −580 V) is employed during the second etch step, to ensure that the etchant species will be directionalized to the bottom of the trench, resulting in rounding of the bottom trench corners.

The detailed methods, preferred process parameters, and experimental examples are provided below.

I. Definitions

As a preface to the detailed description, it should be noted that, as used in this specification and the appended claims, the singular forms "a", "an", and "the" include plural referents, unless the context clearly dictates otherwise.

Specific terminology of particular importance to the description of the present invention is defined below.

The term "anisotropic etching" refers to etching which does not proceed in all directions at the same rate.

The term "bias power" refers to the power applied to the substrate support pedestal to produce a negative voltage on the substrate surface.

The term "bottom trench corner" refers to the transition from the lower sidewall of a trench to the base (bottom) of the trench.

The term "etch profile" (or "feature profile") generally refers to, but is not limited to, the cross-sectional profile of the sidewall of an etched feature. In many instances herein, the etch profile is described in terms of an angle between the sidewall and the surface on which the feature stands (i.e., the substrate). The term "vertical profile" refers to a feature profile wherein a cross-section of the feature exhibits sidewalls which are perpendicular to the surface on which the feature stands. The term "positive profile" (also known as an "undercut" profile) refers to a feature profile wherein the width of the cross-section of the feature is larger as the distance away from the opening on the substrate increases. The term "negative profile" (also known as a "tapered" profile) refers to a feature profile wherein the width of the cross-section of the feature is smaller as the distance away from the opening on the substrate surface increases.

The term "etch rate microloading" refers to the difference between the average etch rate of lines within a dense array of lines and the average etch rate of isolated lines on the same substrate.

The term "feature" refers to, but is not limited to, interconnects, contacts, vias, trenches, and other structures which make up the topography of the substrate surface.

The term "feature size" typically refers to the smallest dimension of a feature.

The term "isotropic etching" refers to etching which proceeds in all directions at the same rate.

The term "selectivity" refers either to 1) the ratio of the etch rate of a first material to the etch rate of a second material, or 2) the etch rate of a first material divided by the etch rate of a second material. If the first material has a faster rate of etching than the second material, then selectivity will be greater than 1:1, or 1.

The term "source power" refers to the power used to generate plasma ions and neutrals, whether directly in an etching chamber or remotely, as in the case of a microwave plasma generator.

The term "top trench corner" refers to the transition from the upper sidewall of a trench to the upper surface of the substrate in which the trench is formed.

The term "wet etch" refers to etching using a liquid reagent.

II. An Apparatus for Practicing the Invention

Figure 2:
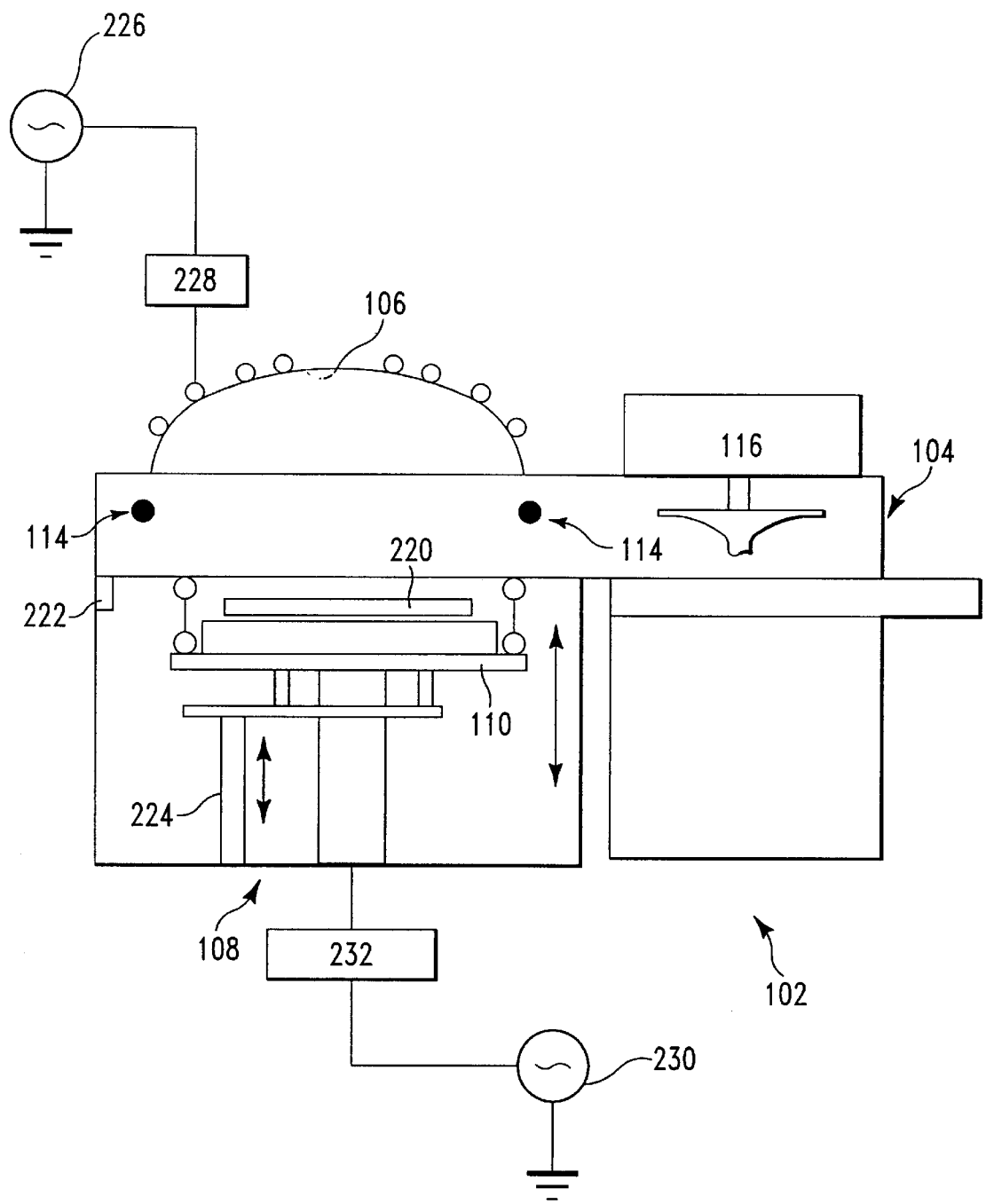
FIG. 2 is a schematic of a cross-sectional side view of an individual CENTURA® DPS™ polysilicon etch chamber 102.

The method of the invention is preferably performed in an etch processing apparatus which provides for separate power control of a plasma generation source and a substrate biasing device. An example of such an apparatus is the Applied Materials' CENTURA® polysilicon etch system. FIGS. 1 and 2 are schematics of an individual CENTURA® DPS™ polysilicon etch chamber 102 of the type used in the Applied Materials' CENTURA® polysilicon etch system. The CENTURA® DPS™ polysilicon etch chamber 102 is configured to be mounted on a standard CENTURA® 5200 etch mainframe.

FIG. 1 shows a detailed schematic of an individual CENTURA® DPS™ polysilicon etch chamber 102 of the type used in the CENTURA® etch system. The CENTURA®DPS™ polysilicon etch chamber 102 consists of an upper chamber 104 having a ceramic dome 106, and a lower chamber 108. The lower chamber 108 includes a monopolar electrostatic chuck (ESC) cathode 110. Gas is introduced into the chamber via four ceramic gas injection nozzles 114. Chamber pressure is controlled by a closed-loop pressure control system 118 with a throttle valve 116.

FIG. 2 shows a schematic of a cross-sectional side view of the polysilicon etch chamber 102. During processing, a substrate 220 is introduced into the lower chamber 108 through inlet 222. The substrate 220 is held in place by means of a static charge generated on the surface of electrostatic chuck (ESC) cathode 110 by applying a DC voltage to a conductive layer located under a dielectric film on the chuck surface. The cathode 110 and substrate 220 are then raised by means of a wafer lift 224 and sealed against the upper chamber 104 in position for processing. Etch gases are introduced into the upper chamber 104 via the ceramic gas injection nozzles 114. The polysilicon etch chamber 102 uses an inductively coupled source 226 at 12.56 MHZ for generating and sustaining a high density plasma. The wafer is biased with an RF source 230 at 13.56 MHZ. Power to the plasma source 226 and substrate biasing means 230 are controlled by separate controllers, 228 and 232, respectively.

An endpoint subsystem (not shown) senses the end of the etch process by monitoring changes in the light emitted by the plasma in the etch chamber 102. The standard CENTURA® DPS™ endpoint system consists of a monochromator and photomultiplier tube which automatically endpoints all etch chambers. A fiber optic cable routes light from a recessed quartz window on the chamber to the monochromator or an optional HOT (High Optical Throughput) pack photomultiplier. When the monochromator is used, light is shone into a motor-driven concave grating. Light is then reflected onto the entrance slit on the photomultiplier tube, which amplifies the light. This data is then displayed on a PC monitor. The operator sets an algorithm which controls the endpoint system. Overetching can be programmed to start either as the film begins to clear or when it has cleared completely. The endpoint time can be adjusted by changing the number of windows that the signal must exit to endpoint. The endpoint wavelength is programmable for each process step. An appropriate endpoint wavelength is selected depending on the films being etched.

Figure 3:
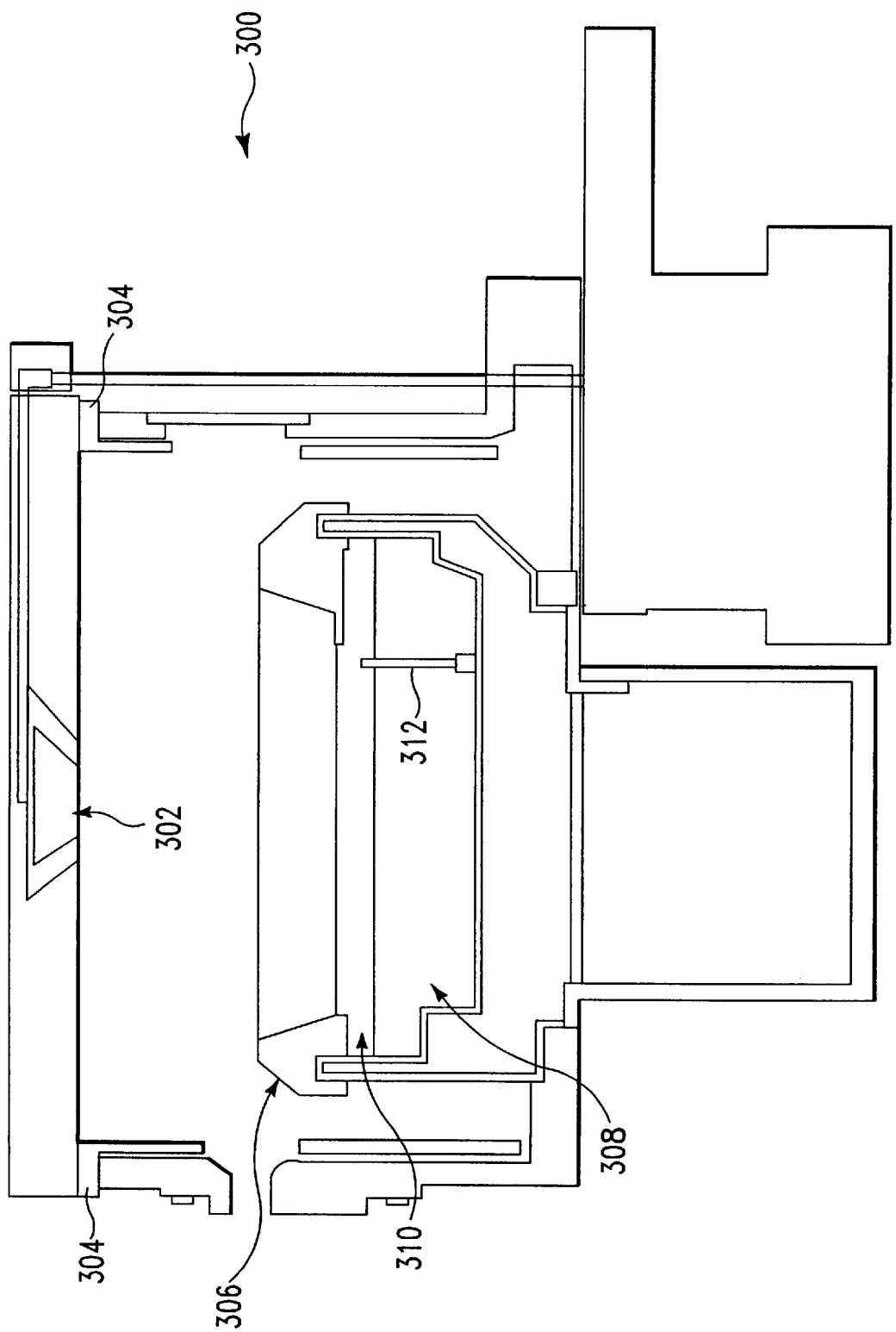
FIG. 3 is a schematic of an Applied Materials' MXP+ polysilicon etch chamber, which is an example of an etch processing apparatus which can be used for performing the method of the invention.

Alternatively, the method of the invention may be performed in an etch processing apparatus wherein power to a plasma generation source and power to a substrate biasing means are controlled by a single power control, such as the Applied Materials' MXP or MXP+ polysilicon etch chamber. FIG. 3 is a schematic of an Applied Materials' MXP+ polysilicon etch chamber 300, which is a parallel plate plasma etch chamber of the kind which is well-known in the art. The MXP+ polysilicon etch chamber offers advantages over other similar etch chambers in that it includes a simplified, two-dimensional gas distribution plate 302, which allows for more uniform gas distribution throughout the chamber. Another modification is a removable aluminum chamber liner 304, which can be easily removed and replaced during each wet cleaning procedure, allowing for a more rapid cleaning cycle. Yet another modification is an improved focus ring 306, which moves together with (rather than independently from) the cathode 308, resulting in reduced particle generation due to fewer moving parts within the apparatus. The high temperature cathode 308 has independent temperature control (not shown), which functions in response to a temperature reading from pedestal temperature probe 312, which permits operation at a temperature in excess of the process chamber temperature. The substrate to be processed (not shown) rests on an electrostatic chuck pedestal 310, which is joined to cathode 308.

III. A First Method for Etching a Silicon Trench Having Rounded Top Corners

Figure 4A:
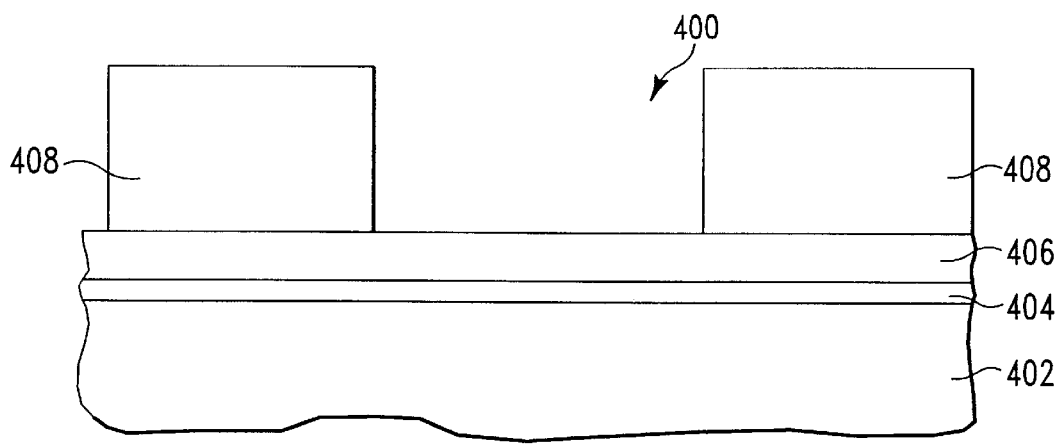
FIG. 4A shows a typical beginning structure 400 for practicing a first top corner rounding embodiment method of the invention. This structure 400 comprises, from top to bottom, a patterned photoresist layer 408, a layer of silicon nitride 406, a layer of silicon oxide 404, and an underlying silicon substrate 402 rate 402.

FIG. 4A shows a schematic of a semiconductor structure 400 comprising an etch stack overlying a silicon substrate 402. This etch stack comprises, from top to bottom, a patterned photoresist layer 408, a silicon nitride layer 406, and a silicon oxide layer 404. The thickness of the patterned photoresist layer 408 is typically within the range of about 4000 Å to about 10,000 Å. The silicon nitride layer 406 typically has a thickness within the range of about 1000 Å to about 2000 Å. The silicon oxide layer 404 typically has a thickness within the range of about 50 Å to about 350 Å. The relative thicknesses of the film layers illustrated in FIGS. 4A–4D are not to scale. The drawings are intended only to show the relative positions of the various layers on silicon substrate 402.

The patterned photoresist layer 408 may be any suitable photoresist material patterned using techniques known in the art. Typically, the photoresist layer material is an organic, carbon-containing material. The thickness and patterning method for the photoresist 408 will depend on the particular photoresist material used. A frequently used photoresist is a DUV photoresist available from either JSR or Shipley. A typical film thickness for a DUV photoresist ranges from about 4,000 to about 10,000 Å.

Figure 4B:
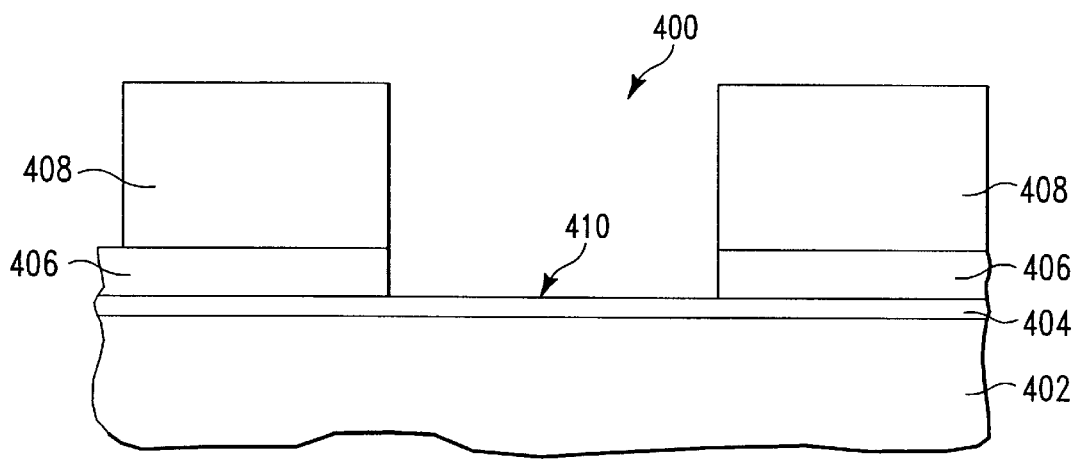
FIG. 4B shows the structure 400 of FIG. 4A after pattern etching of the silicon nitride layer 406. The top surface 410 of the silicon oxide layer 404 is exposed during the silicon nitride pattern etching step.

Referring to FIG. 4B, the silicon nitride layer 406 has been pattern etched (opened) to expose a surface 410 of the silicon oxide layer 404. Preferably, the silicon nitride layer 406 is pattern etched using a plasma generated from a plasma feed gas comprising $SF_6$, in combination with a profile control additive such as HBr or $CHF_3$. Etch process conditions are apparatus-sensitive, but one skilled in the art can determine appropriate conditions for a given apparatus by minimal experimentation, based on process conditions generally known in the art.

Figure 4C:
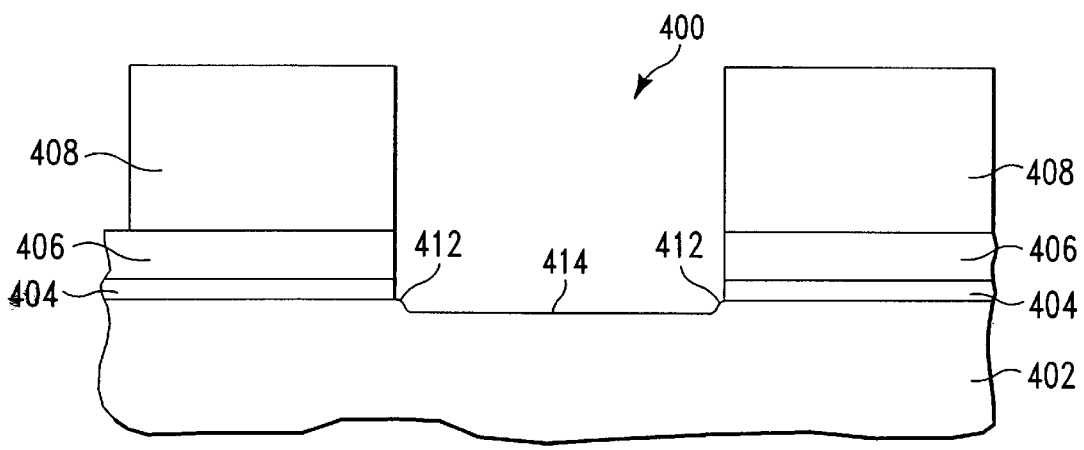
FIG. 4C shows the structure 400 of FIG. 4B after the break-through step in which the silicon oxide layer 404 and the top portion of the silicon substrate 402 are etched. The top corners 412 of the silicon substrate 402 are rounded during this silicon oxide breakthrough step.

A "break-through" step is then performed to remove the silicon oxide layer 404 from the open patterned areas overlying silicon substrate 402. As shown in FIG. 4C, the break-through step is carried out to an "over etch" condition, so that not only is the silicon oxide layer 404 removed, but a portion of the upper surface 414 of the silicon substrate 402 is etched in a manner which generates a rounded shape 412 adjacent the sidewalls of the silicon oxide layer 404. Typically, in order to obtain the rounded shape 412 near the surface 414 of the silicon substrate 402, it is only necessary to etch the silicon substrate to a depth within the range of about 100 Å and about 400 Å, preferably, within the range of about 100 Å and about 200 Å, during the silicon oxide breakthrough etch.

The breakthrough etch is performed using a specialized plasma generated from a plasma feed gas comprising carbon and fluorine. The reactive species generated from the carbon and fluorine-comprising plasma react with the silicon oxide in layer 404 to form the volatile reaction products $SiF_4$ and $CO_2$. The availability of carbon from residual photoresist layer 408, and from the plasma feed gas make possible the silicon oxide etching at a lower substrate bias (typically less than about –200 V), which provides a gentle rounding of the upper trench corners, since these corners are not as highly bombarded by ions attracted by the substrate bias. In instances where there is minimal photoresist residue available, it may be necessary to increase the amount of carbon present in the plasma feed gas. This may be done by increasing the amount of a carbon-fluorine containing compound in the feed gas, by addition of a carbon-containing compound such as $CH_4$ to the feed gas, or a combination of both.

The break-through etch step is carried out for a time period sufficient to provide an overetch. (For a feature size of about 0.35µ, a typical overetch is about 300–400 Å into the silicon substrate and the rounding of the upper corners of the silicon trench provides a rounded top corner having a radius of about 15 to about 25 nm.) The trench is subsequently etched to a desired depth using a different etch chemistry. It is also possible that there is some formation of polymeric residue near the side wall of the etched silicon oxide layer 404 which acts as a sacrificial mask for the silicon substrate directly underneath the silicon oxide layer, and that this contributes to the rounding of the upper corner of the silicon surface during the break-through step.

The plasma feed gas for the break-through step may further include oxygen ($O_2$), which may be used to improve the top corner rounding effect. The presence of $O_2$, during the overetch of the silicon tends to form silicon oxide which may serve as passivating agent. at the edge of the top trench corner. The presence of the polymeric residue adjacent the sidewall of the etched silicon oxide layer, in combination with a silicon oxide build-up in the same area during the overetch portion of the break-through step both may contribute to formation of the rounded top corner 412 at the upper surface 414 of the silicon substrate 402 during subsequent etching of the silicon trench.

The principal etchant of the plasma feed gas which is used to perform the breakthrough etch may be selected from the group consisting of $CF_4$, $CHF_3$, $CH_2F_2$, $CH_3F$, and combinations thereof. Experimental results have demonstrated that a principal etchant selected from the group consisting of $CF_4$, $CHF_3$, and combinations thereof works well. $CF_4$ provides excellent results. If there is insufficient photoresist residue available, or the imaging mask used for initial patterning of the etch stack does not contain carbon, the plasma feed gas may further include $CH_4$ to increase the amount of polymer formation. Further, the addition of $O_2$ may be used to adjust the amount of polymer formation when $CH_4$ is added to the plasma source gas.

The plasma feed gas for the breakthrough etch preferably further includes a nonreactive, diluent gas selected from the group consisting of argon, helium, xenon, krypton, and combinations thereof. The nonreactive, diluent gas is most preferably argon. The nonreactive, diluent gas dilutes the carbon and fluorine-containing gas, slowing down the overall rate of etching and increasing the selectivity of etching the silicon oxide layer relative to etching of the photoresist layer. In general, a fast silicon oxide etch rate is not desired, because the silicon oxide layer is so thin that etching is completed quickly even if the silicon oxide etch rate is relatively low, and it is desired to provide time to permit formation of the polymer-oxide combination build-up adjacent the sidewall of the etched silicon oxide layer during the silicon oxide breakthrough etch step.

Table One, below, provides process conditions for the first method of top corner rounding described above. In addition to providing the process conditions for the breakthrough, corner rounding step, the table provides process conditions for a compatible pattern etching of the silicon nitride layer. This compatible silicon nitride pattern etching step can be carried out in the same process chamber as the breakthrough, corner rounding step. The process conditions provided in Table One are specific to the use of a processing apparatus in which the source power and bias power are separately controlled, such as the Applied Materials' CENTURA® DPS™ polysilicon etch system, shown in FIGS. 1 and 2. However, the first top corner rounding method is not intended to be limited to use of this specific apparatus. One skilled in the art can use the teachings provided herein to adapt the corner rounding method to other apparatus.

TABLE One

Example Process Conditions for Silicon Nitride Pattern Etching and The First Method Of Silicon Trench Top Corner Rounding

| Process Parameter | Silicone Nitride Pattern Etching | Silicon Oxide Breakthrough Etch |
|---|---|---|
| $CF_4$ Flow Rate (sccm) | — | 20–140 |
| $CH_4$ Flow Rate (sccm) | — | 0–40 |
| $SF_6$ Flow Rate (sccm) | 30–120 | — |
| HBr Flow Rate (sccm) | 30–160 | — |
| $O_2$ Flow Rate (sccm) | — | 0–20 |
| Argon Flow Rate (sccm) | — | 40–160 |
| Typical Total Gas Flow (sccm) | 60–280 | 60–200 |
| RF Source Power (W) | 300–1200 | 300–1200 |

TABLE One-continued

Example Process Conditions for Silicon Nitride Pattern Etching and The First Method Of Silicon Trench Top Corner Rounding

| Process Parameter | Silicone Nitride Pattern Etching | Silicon Oxide Breakthrough Etch |
|---|---|---|
| RF Bias Power (W) | 50–450 | 25–150 |
| Process Chamber Pressure (mTorr) | 10–80 | 10–80 |
| Substrate Temperature (° C.) | 10–70 | 10–70 |
| Plasma Electron Density (e/cm$^3$) | $10^9$–$10^{12}$ | $10^9$–$10^{12}$ |

Figure 4D:
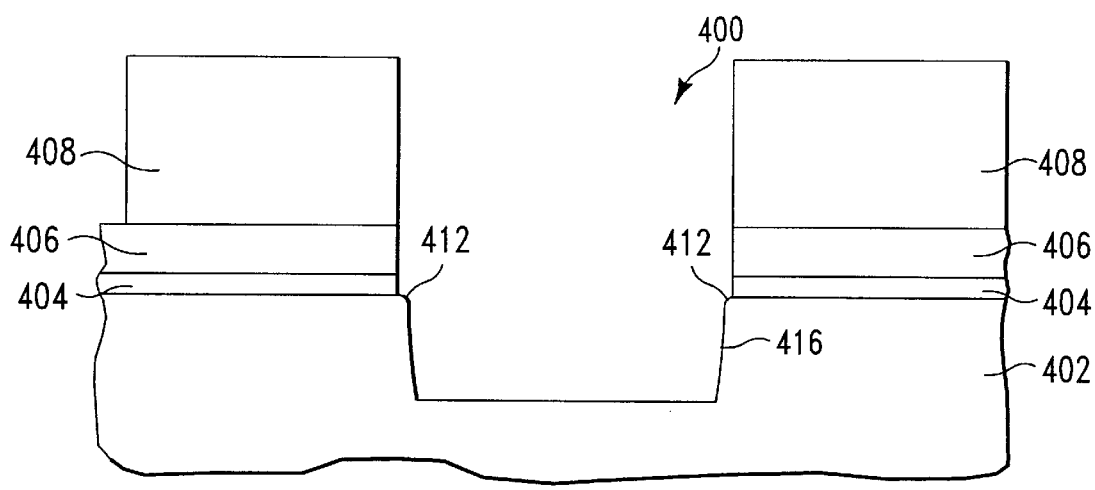
FIG. 4D shows the structure 400 of FIG. 4C after etching of a shallow trench 416 into the silicon substrate 402.

After performance of the silicon oxide break-through step, the general etching of the trench in the silicon substrate is then performed. FIG. 4D shows the structure 400 of FIG. 4C after etching of a shallow trench 416 into the silicon substrate 402. The trench is typically etched to a depth within the range of about 2000 Å to about 6000 Å. The final trench depth is dictated by the final end use application for the trench and the electrical requirements for the resulting semiconductor device.

The trench 416 is etched using conventional silicon etch chemistry. The plasma feed gas for the silicon trench etch preferably comprises HBr in combination with $O_2$. Optionally, $Cl_2$, and/or $SF_6$ may be added to the plasma feed gas.

EXAMPLE ONE

The First Method of Top Corner Rounding

The semiconductor structure 400 shown in FIG. 4 was the starting substrate. This structure included a patterned photoresist layer 408, a silicon nitride layer 406, and a silicon oxide layer 404, deposited on a single-crystal silicon substrate 402. The patterned photoresist 408 was a Deep UV (DUV) photoresist proprietary to and provided by Shipley Co. (Massachusetts). The thickness of patterned photoresist 408 was approximately 6000 Å. The silicon nitride layer 406 had a thickness of approximately 1500 Å. The silicon oxide layer 404 had a thickness of approximately 120 Å.

The silicon nitride layer 406 was pattern etched using a plasma generated from a feed gas of 60 sccm $SF_6$ and 60 sccm HBr. The silicon nitride layer 406 was etched using the following process conditions: 40 mTorr process chamber pressure; 300–1500 W plasma source power (depending on the desired etch rate); 150 W bias power; and a substrate temperature of about 20° C. Etching was stopped upon reaching the silicon nitride/silicon oxide interface. The silicon nitride/silicon oxide interface was detected by optical emission spectroscopy (OES).

The first top corner rounding method of the present invention was then performed during the break-through step in which the silicon oxide layer and a portion of the silicon substrate were etched. The silicon substrate was etched to a depth of approximately 200 Å.

Various etchant gas compositions and process conditions were used to perform the silicon oxide breakthrough step. Tables Two through Five, below, provide process conditions such as plasma feed gas composition, process chamber conditions and power input parameters for a number of experimental trials which were carried out during development of the first top corner rounding method.

TABLE Two

First Top Corner Rounding Method, Developmental Data

| Run # | 1 | 2 | 3 | 4 | 5 | 6 | 7 |
|---|---|---|---|---|---|---|---|
| $CF_4$ (sccm) | — | — | — | 80 | 50 | 80 | 80 |
| $SF_6$ (sccm) | 20 | 20 | 20 | — | — | — | — |
| Ar (sccm) | — | — | — | — | — | 120 | 120 |
| HBr (sccm) | 140 | 140 | 140 | — | — | — | — |
| $O_2$ (sccm) | — | 10 | 10 | — | 5 | — | — |
| He (sccm) | — | — | — | — | — | — | — |
| He—$O_2$ (sccm) | — | — | — | — | — | — | — |
| Total Gas Flow (sccm) | 160 | 170 | 170 | 80 | 55 | 200 | 200 |
| Proc. Chamber Pressure (mTorr) | 5 | 5 | 80 | 70 | 4 | 70 | 10 |
| Source Power (W) | 750 | 750 | 750 | 1000 | 500 | 1000 | 1000 |
| Bias Power (W) | 100 | 100 | 100 | 70 | 40 | 100 | 100 |
| Substrate Temp. (° C.) | 50 | 50 | 50 | 50 | 50 | 50 | 50 |
| $SiO_2$ Etch Time (s) | 40 | 40 | 40 | 40 | 40 | 30 | 15 |
| $SiO_2$ Etch Rate (Å/min) | 775 | 727 | 106 | 325 | 942 | 611 | 2240 |
| $SiO_2$ Etch Uniformity* | 2.5 | 2.7 | 4.8 | 4.6 | 3.0 | 6.7 | 3.5 |
| Si Etch Time (s) | 80 | 80 | 80 | 80 | 60 | 60 | 60 |
| Si Etch Rate (Å/min) | 2885 | 3078 | 1121 | 910 | 919 | 852 | 1392 |
| Si Etch Uniformity* | 2.2 | 2.9 | 5.4 | 3.0 | 2.0 | 2.9 | 1.8 |
| Photoresist Etch Rate (Å/min) | 1444 | 1927 | 346 | 828 | 1377 | 1333 | 1978 |
| $SiO_2$:Si (Selectivity) | 0.27 | 0.24 | 0.10 | 0.36 | 1.0 | 0.72 | 1.6 |
| $SiO_2$:PR** (Selectivity) | 0.54 | 0.38 | 0.31 | 0.39 | 0.68 | 0.46 | 1.1 |

TABLE Three

First Top Corner Rounding Method, Developmental Data

| Run # | 8 | 9 | 10 | 11 | 12 | 13 | 14 |
|---|---|---|---|---|---|---|---|
| $CF_4$ (sccm) | 80 | 80 | 80 | 80 | 80 | 80 | 40 |
| $SF_6$ (sccm) | — | — | — | — | — | — | — |
| Ar (sccm) | 120 | — | 120 | 120 | 120 | 120 | 60 |
| HBr (sccm) | — | — | — | — | — | — | — |
| $O_2$ (sccm) | — | — | 10 | 20 | — | — | — |
| He (sccm) | — | — | — | — | — | — | — |
| He—$O_2$ (sccm) | — | — | — | — | — | — | — |
| Total Gas Flow (sccm) | 200 | 80 | 210 | 220 | 200 | 200 | 100 |
| Proc. Chamber Pressure (mTorr) | 10 | 10 | 10 | 10 | 10 | 10 | 10 |
| Source Power (W) | 1000 | 1000 | 1000 | 1000 | 1000 | 300 | 1000 |
| Bias Power (W) | 100 | 100 | 100 | 100 | 200 | 100 | 100 |
| Substrate Temp. (° C.) | 20 | 20 | 20 | 20 | 20 | 20 | 20 |
| $SiO_2$ Etch Time (s) | 15 | 15 | 15 | 15 | 15 | 20 | 15 |
| $SiO_2$ Etch Rate (Å/min) | 2203 | 2135 | 2192 | 2100 | 3041 | 987 | 2090 |
| $SiO_2$ Etch Uniformity* | 3.3 | 3.4 | 3.2 | 3.7 | 3.6 | 4.1 | 3.0 |
| Si Etch Time (s) | 40 | 40 | 40 | 40 | 40 | 40 | 40 |
| Si Etch Rate (Å/min) | 1405 | 1482 | 1684 | 1883 | 2102 | 1007 | 1296 |
| Si Etch Uniformity* | 1.1 | 2.2 | 1.4 | 1.8 | 0.69 | 2.2 | 0.83 |
| Photoresist Etch Rate (Å/min) | 1997 | 2132 | 2311 | 2827 | 3180 | 1322 | 1889 |
| $SiO_2$:Si (Selectivity) | 1.6 | 1.4 | 1.3 | 1.1 | 1.4 | 0.98 | 1.6 |
| $SiO_2$:PR** (Selectivity) | 1.1 | 1.0 | 0.95 | 0.74 | 0.96 | 0.75 | 1.1 |

TABLE Four

First Top Corner Rounding Method, Developmental Data

| Run # | 15 | 16 | 17 | 18 | 19 | 20 | 21 |
|---|---|---|---|---|---|---|---|
| $CF_4$ (sccm) | 80 | 80 | 20 | 20 | 10 | 10 | — |
| $SF_6$ (sccm) | — | — | — | — | — | — | — |
| Ar (sccm) | 120 | — | 60 | 120 | 120 | 200 | 120 |
| HBr (sccm) | — | — | — | — | — | — | — |
| $O_2$ (sccm) | — | 20 | — | — | — | — | — |
| He (sccm) | — | — | — | — | — | — | — |
| He—$O_2$ (sccm) | — | — | — | — | — | — | — |
| Total Gas Flow (sccm) | 200 | 100 | 80 | 140 | 130 | 210 | 120 |
| Proc. Chamber Pressure (mTorr) | 30 | 10 | 30 | 30 | 30 | 30 | 30 |
| Source Power (W) | 1000 | 1000 | 1200 | 1200 | 1200 | 1200 | 1200 |
| Bias Power (W) | 100 | 100 | 50 | 50 | 50 | 50 | 50 |
| Substrate Temp. (° C.) | 20 | 20 | 20 | 20 | 20 | 20 | 20 |
| $SiO_2$ Etch Time (s) | 15 | 15 | 30 | 30 | 30 | 30 | 30 |
| $SiO_2$ Etch Rate (Å/min) | 1553 | 2056 | 1293 | 1222 | 992 | 448 | 72 |
| $SiO_2$ Etch Uniformity* | 4.6 | 3.4 | 3.5 | 2.0 | 0.6 | 4.2 | 27 |
| Si Etch Time (s) | 40 | 40 | 40 | 40 | 40 | 40 | 40 |
| Si Etch Rate (Å/min) | 1179 | 1887 | 815 | 616 | 420 | 388 | 60 |
| Si Etch Uniformity* | 2.8 | 2.3 | 2.2 | 3.6 | 2.9 | 3.4 | 5.2 |
| Photoresist Etch Rate (Å/min) | 1965 | 2926 | 1155 | 969 | 747 | 727 | 161 |
| $SiO_2$:Si (Selectivity) | 1.3 | 1.1 | 1.6 | 2.0 | 2.4 | 1.2 | 1.1 |
| $SiO_2$:PR** (Selectivity) | 0.79 | 0.70 | 1.1 | 1.3 | 1.3 | 0.6 | 0.45 |

TABLE Five

First Top Corner Rounding Method, Developmental Data

| Run # | 22 | 23 | 24 | 25 | 26 | 27 |
|---|---|---|---|---|---|---|
| $CF_4$ (sccm) | 10 | 10 | 10 | 40 | 40 | 40 |
| $SF_6$ (sccm) | — | — | — | — | — | — |
| Ar (sccm) | 200 | — | 200 | 120 | 120 | 120 |
| HBr (sccm) | 20 | 20 | 40 | — | — | — |
| $O_2$ (sccm) | — | — | — | — | — | — |
| He (sccm) | 10 | — | 20 | — | — | — |
| He—$O_2$ (sccm) | — | 10 | — | — | — | — |
| Total Gas Flow (sccm) | 240 | 40 | 270 | 160 | 160 | 160 |
| Proc. Chamber Pressure (mTorr) | 30 | 30 | 30 | 30 | 10 | 30 |
| Source Power (W) | 1200 | 1200 | 1200 | 750 | 750 | 750 |
| Bias Power (W) | 50 | 50 | 50 | 50 | 50 | 100 |
| Substrate Temp. (° C.) | 20 | 20 | 20 | 20 | 20 | 20 |
| $SiO_2$ Etch Time (s) | 30 | 20 | 30 | 30 | 20 | 20 |
| $SiO_2$ Etch Rate (Å/min) | 675 | 546 | 580 | 900 | 1187 | 1296 |
| $SiO_2$ Etch Uniformity* | 6.0 | 3.0 | 7.8 | 4.9 | 3.7 | 4.7 |
| Si Etch Time (s) | 40 | 40 | 40 | 40 | 40 | 40 |
| Si Etch Rate (Å/min) | 1520 | 1606 | 1410 | 700 | 653 | 1030 |
| Si Etch Uniformity* | 9.1 | 2.4 | 8.0 | 1.8 | 1.5 | 1.9 |
| Photoresist Etch Rate (Å/min) | 681 | 1362 | 1354 | 1146 | 967 | 1919 |
| $SiO_2$:Si (Selectivity) | 0.44 | 0.34 | 0.41 | 1.3 | 1.8 | 1.3 |
| $SiO_2$:PR** (Selectivity) | 0.50 | 0.40 | 0.43 | 0.78 | 1.2 | 0.68 |

With regard to each of the above tables, the following applies:

Etch uniformity was measured on patterned, undoped polysilicon substrate specimens, using a Tencor UV 1020 thin film thickness measurement tool. An acceptable etch uniformity is about 3% or less variation.

PR=photoresist.

Silicon oxide:silicon ($SiO_2$:Si) etch selectivity is preferably greater than 1. The maximum $SiO_2$:Si selectivity (2.4) was obtained in Run #19 (refer to Table Four), using the following process conditions: 10 sccm $CF_4$, 120 sccm argon, 30 mTorr process chamber pressure, 1200 W source power, 50 W bias power, and a 20° C. substrate temperature. The optimum top trench corner rounding effect was observed in Run #25 (refer to Table Five), where the process conditions were the same as those in Run #19, with the following exceptions: 40 sccm $CF_4$ and 750 W source power. A typical etch time for about 100 Å of oxide was about 20 seconds. For a given etch process, one skilled in the art can adjust the relative amount of the carbon and fluorine comprising compounds to the plasma feed gas and the amount of power applied to plasma generation to obtain a satisfactory top trench corner rounding effect, while providing an advantageous silicon oxide: silicon etch selectivity.

IV. A Second Method for Etching a Silicon Trench Having Rounded Top Corners

Figure 5A:
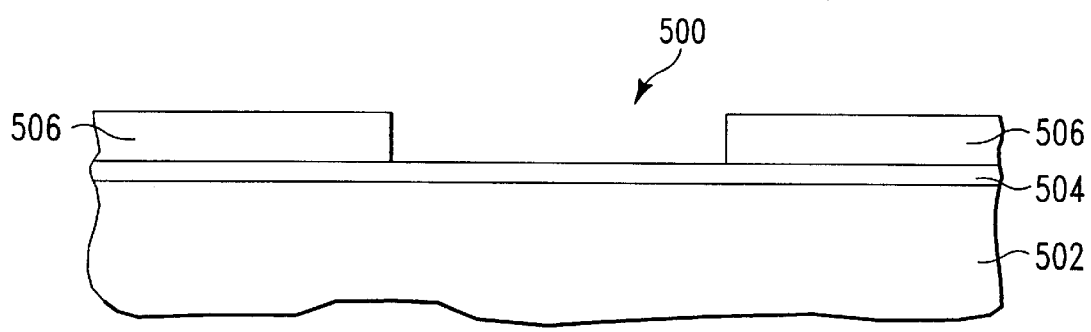
FIG. 5A shows a typical beginning structure 500 for practicing a second top corner rounding embodiment method of the invention. This structure 500 comprises, from top to bottom, a patterned silicon nitride hard mask 506, an adhesion layer of silicon oxide 504, and an underlying silicon substrate 502.

FIG. 5A shows a schematic of a semiconductor structure 500 comprising an etch stack overlying a silicon substrate 502. This etch stack comprises, from top to bottom, a patterned silicon nitride hard mask 506, and a silicon oxide layer 504 overlying a silicon substrate 502. The silicon nitride hard masking layer 506 typically has a thickness within the range of about 1000 Å to about 2000 Å. The silicon oxide layer 504 typically has a thickness within the range of about 50 Å to about 350 Å.

Figure 5B:
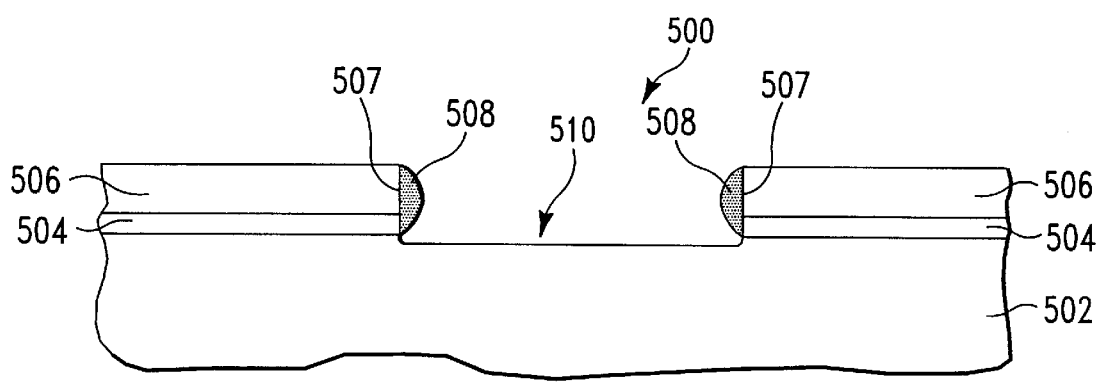
FIG. 5B shows the structure 500 after a break-through step in which the pattern is transferred through silicon oxide adhesion layer 504 and a built-up structure 508 is created on the side wall 507 of silicon nitride hard mask 506.

The break-through step used to etch through the silicon oxide layer 504 as shown in FIG. 5B is also used to create a built-up extension 508 upon sidewall 507 of silicon nitride hard mask 506. The second top corner rounding method break-through step is performed using a plasma generated from a plasma feed gas comprising a source of hydrogen, a source of carbon, a source of fluorine, and a source of surface bombardment atoms. Typically the surface bombardment atom source is an inert plasma feed gas such as argon, helium, krypton, nitrogen, xenon, or a combination thereof. Argon works particularly well. A single compound may be used to provide the hydrogen, carbon, and fluorine. Typically more than one gaseous compound is used. It is important to have a controlled amount of carbon present in the process chamber at the time of the breakthrough step. While the hydrogen and the carbon are used to form polymeric material which deposits upon the silicon nitride sidewall, the fluorine and bombardment atoms (typically argon) provide for removal of native oxide layers. Examples of hydrogen sources include $H_2$, HBr (which requires the presence of an increased amount of carbon in the process chamber to work well), $NH_3$, $CHF_3$, $CH_2F_2$, $CH_3F$, $CH_4$, and combinations thereof. Several of these hydrogen-containing compounds may also serve as carbon and fluorine sources. An excellent fluorine source is $CF_4$.

One of the recommended plasma feed gas recipes is a combination of $CF_4$, HBr, and argon. The combination of the $CF_4$ with either HBr, $CH_2F_2$, or a combination of these gases results in the formation of a $C_xH_y$-based polymer on the silicon nitride sidewall 507. This combination of plasma feed gases is capable of providing polymer deposits in the absence of a photoresist, and is not dependent on the amount of residue available from a previous process step.

The plasma feed gas chemistry (i.e., $CF_4$, argon, and HBr or $CH_2F_2$) is preferably made more reactive using an RF source capable of producing a higher electron density. The combination of polymer deposits with byproducts from the silicon oxide etch which make up extension 508 act as a sacrificial mask to prevent the silicon at the silicon oxide/silicon interface at the top of the trench from being etched until desired.

A combination of a high process chamber pressure (within the range of about 40 mTorr and about 90 mTorr) and a low substrate bias (within the range of about −300 V and about −350 V) during the silicon oxide breakthrough step enhances the chemical reaction of the gases and prevents directional etching of the silicon substrate. The depth to which the silicon 502 is etched during the breakthrough step is minimal (typically less than about 100 Å during a 20-second breakthrough etch), so silicon erosion adjacent silicon oxide layer 504 is not a problem. Argon gas may be used to enhance the plasma density, and provides bombarding high energy species which assist in break through of native oxides.

Because the extension 508 deflects the etchant species further down the substrate sidewall, the result is the formation of a more rounded shape (a corner or edge 512 having a larger radius) on the upper sidewall of the silicon substrate.

Table Six, below, provides process conditions which have shown excellent results for performing a silicon nitride pattern etching step which is compatible with the silicon oxide break-through step and for the silicon oxide break-through step in which an extension is formed on the side walls of the silicon nitride hard mask. The process conditions provided in Table Six are specific to the use of a processing apparatus in which the source power and bias power are separately controlled, such as the Applied Materials' CENTURA® DPS™ polysilicon etch system, shown in FIGS. 1 and 2.

TABLE Six

Process Conditions for Silicon Nitride Pattern Etching
and The Second Method For Silicon Trench Top Corner Rounding

| Process Parameter | Silicon Nitride Pattern Etching | Silicon Oxide Break-through Step |
|---|---|---|
| $CF_4$ Flow Rate (sccm) | — | 20–80 |
| $SF_6$ Flow Rate (sccm) | 30–120 | — |
| HBr Flow Rate (sccm) | 30–160 | 50–100* |
| $CH_2F_2$ (sccm) | — | 30–150* |
| $O_2$ Flow Rate (sccm) | — | — |
| Argon Flow Rate (sccm) | — | 60–120 |
| Typical Total Gas Flow (sccm) | 60–280 | 110–300 |
| RF Source power (W) | 300–1200 | 1000–1800 |
| RF Bias Power (W) | 50–450 | 40–100 |
| Substrate Bias Voltage (−V) | | −200—450 |
| Process Chamber Pressure (mTorr) | 10–80 | 50–90 |
| Substrate Temperature (° C.) | 10–70 | 10–50 |
| Plasma Electron Density (e/$cm^3$) | $10^9$–$10^{12}$ | $10^9$–$10^{12}$ |

*Generally, either HBr or $CH_2F_2$ is used. It is possible to use a combination of such hydrogen source gases, but this is a complication of the etch process.

Specific examples for performing the method of the present invention are provided below.

EXAMPLE TWO

The semiconductor structure 500 shown in FIG. 5A was the starting substrate for the second top corner rounding method. This structure includes the silicon nitride hard mask 506, and silicon oxide layer 504, deposited on a single-crystal silicon substrate 502, as previously described. The silicon nitride masking layer 506 had a thickness of approximately 2,000 Å. The silicon oxide layer 504 had a thickness of approximately 150 Å.

The silicon oxide break-through step which also formed extension 508 was performed using a plasma generated from a plasma feed gas containing 40 sccm $CF_4$, 75 sccm argon, and either 50 sccm $CH_2F_2$ or 70 sccm HBr. The silicon oxide breakthrough step was performed using the following process conditions: 70 mTorr process chamber pressure; 1200 W source power; 70 W (–335 V) bias power; and 20° C. substrate temperature.

FIG. 5B shows the structure 500 of FIG. 5A following the silicon oxide breakthrough step. There was a critical dimension gain of approximately 150 Å, which represents the extension 508 formed on the sidewall 507 of the silicon nitride layer 506.

Silicon trench etching was then performed using the two-step silicon etch process described below, which provides rounded top corners and rounded bottom corners. This two-step silicon trench etch is useful not only as a part of this second method for etching a silicon trench having rounded top corners, but can also be used in combination with the first method for etching a silicon trench having rounded top corners.

V. A Method for Etching a Silcone Trench Having Rounded Bottom Corners

Figure 5C:
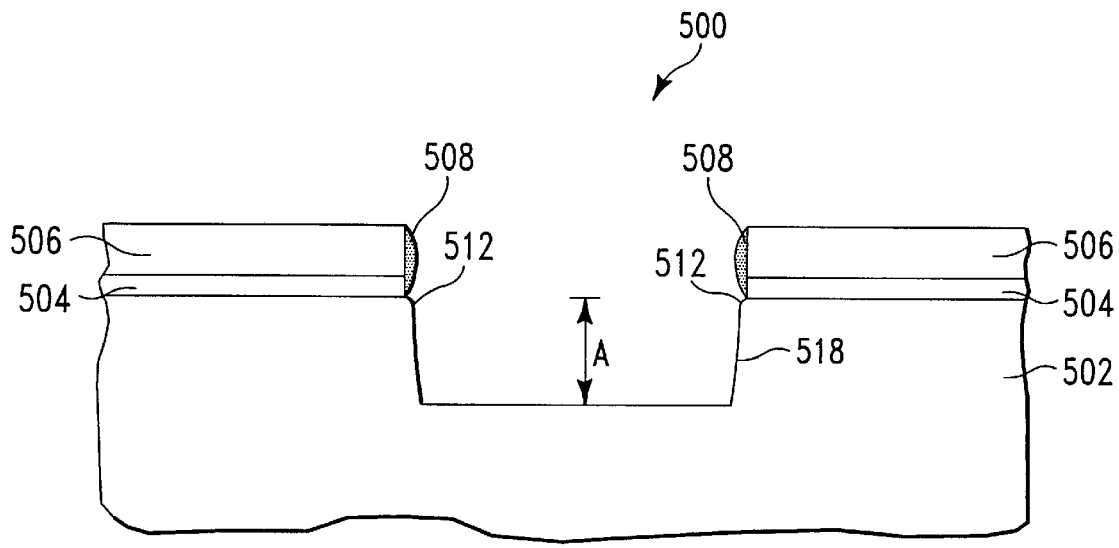
FIG. 5C shows the structure 500 after a first silicon trench etch step in which a shallow trench 518 is etched into silicon substrate 502 to a depth "A" which is equal to about 85–90% of the final desired depth for trench 518.
Figure 5D:
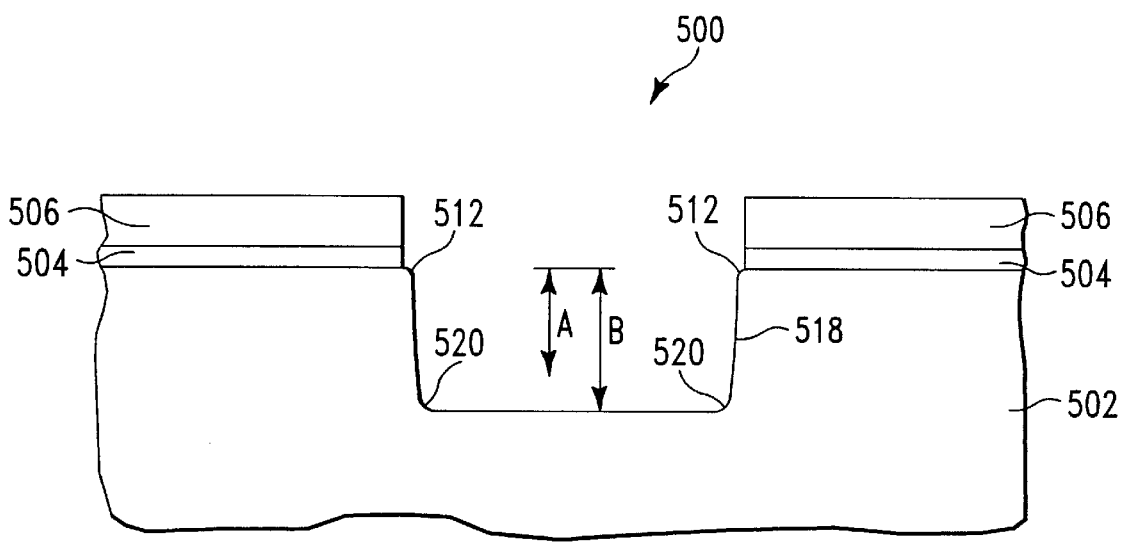
FIG. 5D shows the structure 500 after a second etch step in which the shallow trench 518 is etched to its desired final depth B into silicon substrate 502. The bottom corners 520 of the trench 518 are rounded during this second etch step.

FIGS. 5C and 5D illustrate a two-step silicon trench etch process, wherein the first step provides a rounded top corner in the second method for etching a silicon trench having rounded top corners, and wherein the second step provides a rounded bottom corner, if desired. The two step silicon trench etch process, when used in conjunction with either the first or second method for providing top corner rounding, produces overall curved trench profiles, with minimal risk of trench stress areas.

In the first silicon etch step, shown in FIG. 5C, a trench 518 is etched to a depth A which is within the range of about 75% and about 95% of its desired final depth using conventional silicon etch chemistry with a process chamber pressure within the range of about 20 mTorr and about 40 mTorr. For example and not by way of limitation, the first silicon etch step is typically performed using a plasma generated from a plasma feed gas comprising $Cl_2$ and $O_2$, under the following process conditions. Ninety (90) sccm $Cl_2$; 10 sccm $O_2$; 30 m Torr chamber pressure; 1,000 W source power; and 200 W bias power. Other silicon etch chemistry known in the art may be used as well. The important concept is that only a portion of the trench is etched at the initial chamber pressure, with the subsequent completion of the trench etch being carried out at increased chamber pressure.

In the second silicon etch step, shown in FIG. 5D, the process chamber pressure is increased. The trench 518 is etched to its desired final depth B using conventional silicon etch chemistry with a process chamber pressure within the range of about 50 mTorr and about 90 mTorr, resulting in rounding of the bottom trench corners 520. For example and not by way of limitation, the second silicon etch step is typically performed using a plasma generated from a plasma feed gas comprising $Cl_2$, $O_2$, and $SF_6$, under the following process conditions. Ninety (90) sccm $Cl_2$; 10 sccm $O_2$; 10 sccm $SF_6$; 55 mTorr chamber pressure; 1,000 W source power; and 200 W bias power. $SF_6$ is optionally added to the plasma feed gas in the second silicon etch step for the purpose of enhancing the lateral etching, to provide better bottom corner rounding.

Table Seven, below, provides general process conditions for each step of the two-step silicon trench etch processes. The process conditions provided in Table Seven are specific to the use of a processing apparatus in which the source power and bias power are separately controlled, such as the Applied Materials' CENTURA® DPS™ polysilicon etch system, shown in FIGS. 1 and 2.

TABLE Seven

Process Conditions for Two-Step Silicon Trench Etch

| Process Parameter | Silicon Trench Etch First Step | Silicon Trench Etch Second Step |
| --- | --- | --- |
| $SF_6$ Flow Rate (sccm) |  | 5–20 |
| $O_2$ Flow Rate (sccm) | 2–20 | 2–20 |
| $Cl_2$ Flow Rate (sccm) | 40–200 | 40–250 |
| Typical Total Gas Flow (sccm) | 42–220 | 42–270 |
| RF Source Power (W) | 800–1600 | 800–1600 |
| RF Bias Power (W) | 150–400 | 150–400 |
| Substrate Bias Voltage (–V) | –400—600 | –400—600 |
| Process Chamber Pressure (mTorr) | 10–50 | 50–100 |
| Substrate Temperature (° C.) | 10–70 | 10–70 |
| Plasma Electron Density (e/cm$^3$) | $10^9$–$10^{12}$ | $10^9$–$10^{12}$ |

EXAMPLE THREE

A two-step silicon etch process was then performed to provide a trench with a rounded bottom. In the first silicon etch step, the trench was etched to a depth of 2,500 Å using 90 sccm $Cl_2$ and 5 sccm $O_2$. The first silicon etch step was performed using the following process conditions: 25 mTorr process chamber pressure; 1000 W source power; 200 W (–500 V) bias power; and 20° C. substrate temperature.

In the second silicon etch step, the trench was etched to a final depth of 3,000 Å using 90 sccm $Cl_2$, 5 sccm $O_2$, and 10 sccm $SF_6$. The second silicon etch step was performed using the following process conditions: 55 mTorr process chamber pressure; 1000 W source power; 200 W (–520 V) bias power; and 20° C. substrate temperature. The increased process chamber pressure, in combination with the presence of $SF_6$, during the second silicon etch step enhanced the lateral etching, resulting in rounding of the bottom trench corners.

Using prior art methods, the silicon trench etch step typically has a somewhat deleterious effect on the silicon nitride taper angle. However, when the silicon oxide breakthrough chemistry of the present invention is used, the silicon nitride taper angle is not adversely affected.

Preliminary experiments showed that the etch depth uniformity across the wafer is well within industry requirements using this breakthrough chemistry. Etch rate microloading was measured to be less than about 2%.

The methods of the present invention provide for plasma etching a trench having rounded top and bottom corners in a silicon substrate. Using this method in combination with known etch techniques for controlling the silicon trench sidewall taper, it is possible to provide a predetermined cross-sectional trench sidewall shape, as illustrated in FIGS. 6A through 6F.

Figure 6A:
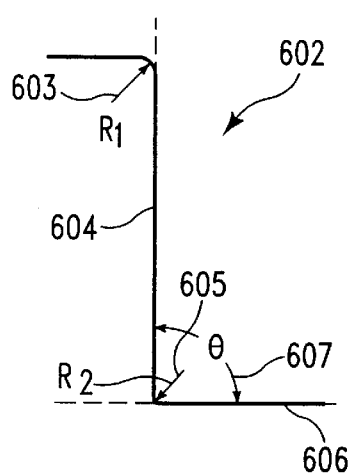
FIGS. 6A through 6F show a series of schematics of trench wall shapes which can be obtained using the method of the invention, where the radius of the trench corners at the top and bottom of the trench, as well as the sidewall slope are controlled.
Figure 6B:
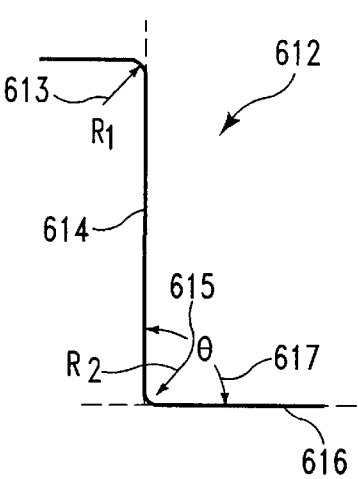

In FIG. 6A, the silicon trench profile 602 exhibits a top corner radius 603 and the bottom corner radius 605 which are tighter (smaller), and the slope of sidewall 604 relative to the base 606 of profile 602, as indicated by angle θ 607 is nearly 90 degrees. In FIG. 6B, the silicon trench profile 612 exhibits a top corner radius 613 and the bottom corner radius 615 which are more open (larger), while the slope of sidewall 614 relative to the base 616 of profile 612, as indicated by angle θ 617 remains at nearly 90 degrees. An increase in top corner radius may be achieved by using the second top corner rounding method rather than the first top corner rounding method, as described above. Within a given corner rounding method (top or bottom corner rounding), an increase in radius is generally achieved by increasing the etch time during corner formation.

Figure 6C:
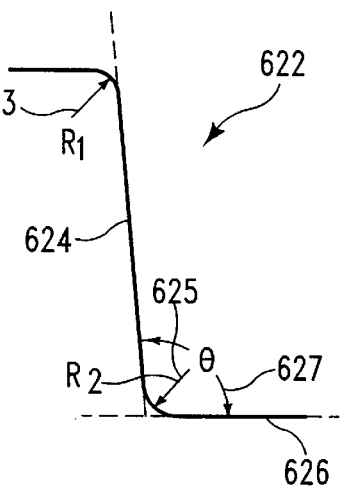
Figure 6D:
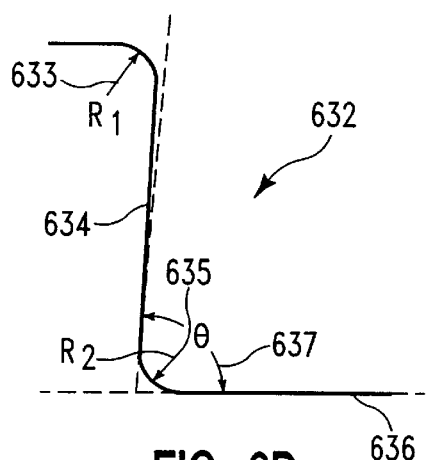

In FIG. 6C, the silicon trench profile 622 exhibits a top corner radius 623 and the bottom corner radius 625 which are more open (larger). In addition, the slope of sidewall 624 relative to the base 626 of profile 622, as indicated by angle θ 627 has been increased, to provide a tapered or negative profile trench. In FIG. 6D, the silicon trench profile 632 exhibits a top corner radius 633 and the bottom corner radius 635 which are more open (larger), while the slope of sidewall 634 relative to the base 636 of profile 632, as indicated by angle θ 637, provides a positive profile trench. It is generally known in the art that the addition of HBr to a $Cl_2/O_2$ etch chemistry will produce a more tapered (negative) profile trench.

Figure 6E:
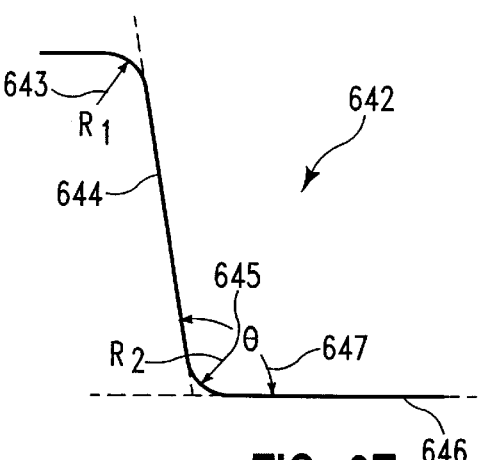
Figure 6F:
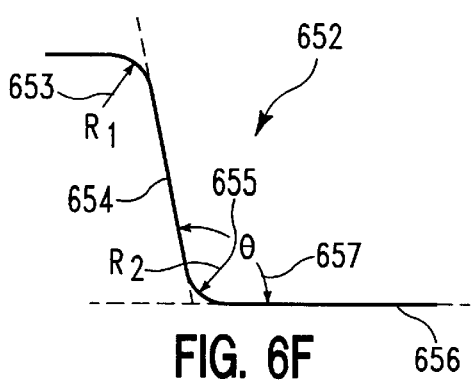

In FIGS. 6E and 6F, the silicon trench profiles 642 and 652, respectively, exhibit a top corner radius (643 and 653) and a bottom corner radius (645 and 655) which are more open (larger), and the slope of the trench sidewalls 644 and 654, respectively, provide a tapered or negative profile trench. However, profile 642 is for a deeper trench than profile 652, where the length of sidewall 644 of profile 642 is considerably greater than the length of sidewall 654 of profile 652, so that the overall shape of the trench profile is considerably different.

FIGS. 6A through 6F illustrate the considerable difference in the overall shape of the trench profile which may be achieved by combining the corner rounding methods of the present invention with methods for altering the trench sidewall taper.

Figure 7:
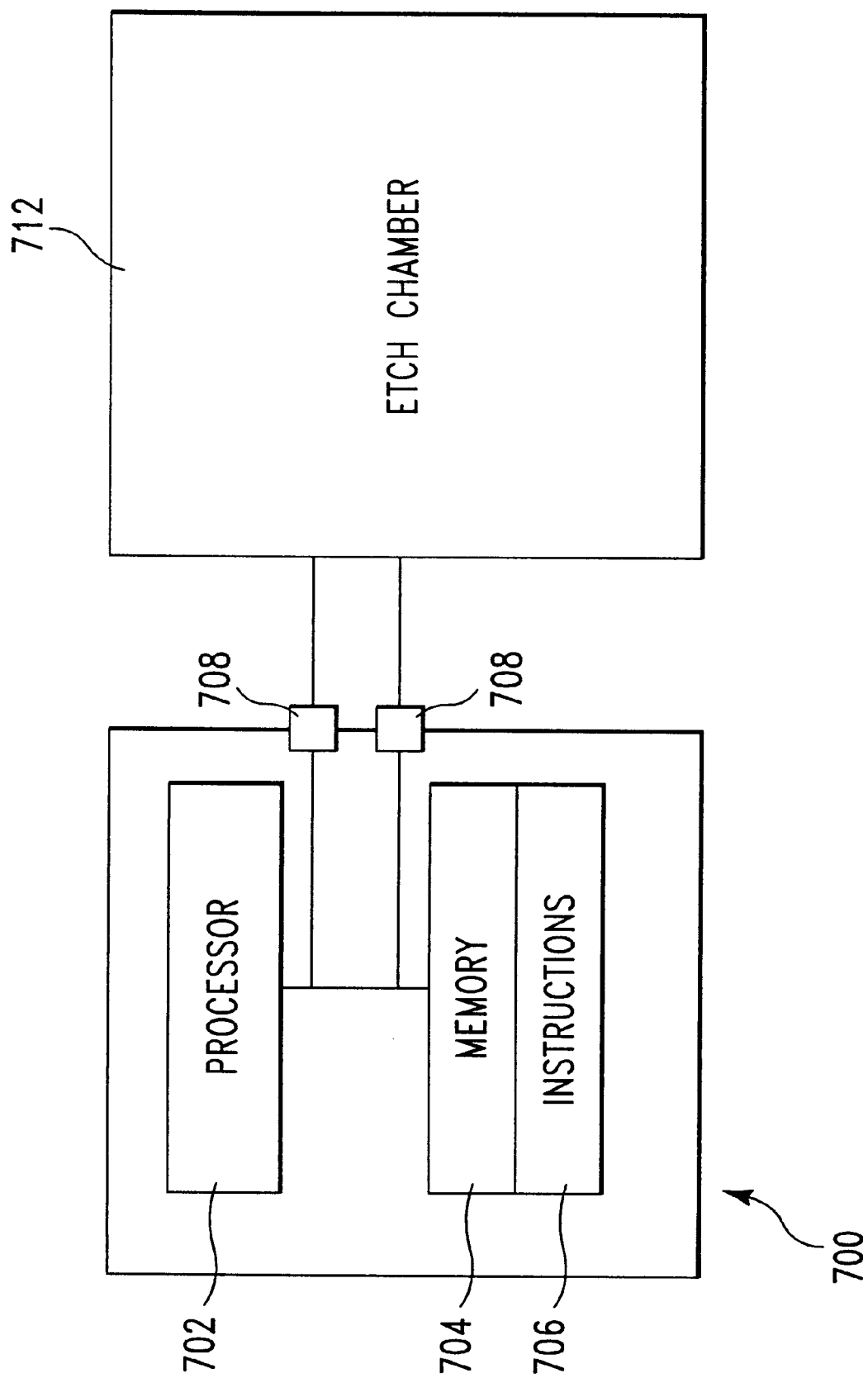
FIG. 7 shows a computer adapted to control a plasma etch system, to carry out the method of the invention.

Preferably, the apparatus used to practice the present invention is adapted to be controlled by a computer. FIG. 7 shows a computer 700. Computer 700 comprises a processor 702, memory 704 adapted to store instructions 706, and one or more ports 708. Processor 702 is adapted to communicate with memory 704 and to execute instructions 706. Processor 702 and memory 704 are also adapted to communicate with one or more ports 708. Ports 708 are adapted to communicate with a plasma etch chamber 712. Plasma etch chamber is adapted to carry out process steps in accordance with signals received from processor 702 via ports 708. Preferably, computer 702 can control the composition and feed rate of the plasma source gas, the temperature, the pressure in the chamber, the bias power, the plasma source generation power. Preferably, computer 702 is adapted to receive measurements that describe the condition in the chamber, and adapt the process variables accordingly. This programmed control of process variables enables production of a predetermined device etch profile of the kind described above.

The above described preferred embodiments are not intended to limit the scope of the present invention, as one skilled in the art can, in view of the present disclosure, expand such embodiments to correspond with the subject matter of the invention claimed below.

We claim:

1. A method for plasma etching a trench having a rounded top corner in a silicon substrate, the method comprising the following steps:
   a) providing a semiconductor structure comprising residue from an organic photoresist, and a silicon oxide layer overlying a silicon substrate;
   b) plasma etching at least a portion of said organic photoresist residue, through said silicon oxide layer, and into an upper portion of said silicon substrate using active species generated from a feed gas comprising carbon and fluorine;
   c) plasma etching a trench into said silicon substrate using active species generated from a feed gas different from that used in step b).

2. The method of claim 1, wherein said plasma feed gas includes $CH_4$.

3. The method of claim 1 or claim 2, wherein said feed gas includes a diluent, non-reactive gas.

4. The method of claim 1 or claim 2, wherein said feed gas includes a carbon and fluorine comprising compound selected from the group consisting of $CF_4$, $CHF_3$, $CH_2F_2$, $CH_3F$, and combinations thereof.

5. The method of claim 3, wherein said feed gas includes a carbon and fluorine comprising compound selected from the group consisting of $CF_4$, $CHF_3$, $CH_2F_2$, $CH_3F$, and combinations thereof.

6. The method of claim 3, wherein said diluent gas is selected from the group consisting of argon, helium, xenon, krypton, and combinations thereof.

7. The method of claim 1, or claim 2, wherein said feed gas includes oxygen.

8. The method of claim 3, wherein said feed gas includes oxygen.

9. A method for plasma etching a trench having a rounded top corner in a silicon substrate, the method comprising the following steps:
   a) providing a semiconductor structure comprising a patterned hard mask, and a silicon oxide layer overlying a silicon substrate;
   b) plasma etching through said silicon oxide layer, while forming an extension on a sidewall of said patterned hard mask, using reactive species generated from a feed gas comprising a source of fluorine, a source of carbon, a source of hydrogen, and a source of high energy species which provide physical bombardment of native oxide surfaces;
   c) plasma etching a trench into said silicon substrate using active species generated from a feed gas different from that used in step b).

10. The method of claim 9, wherein said source of hydrogen is selected from the group consisting of HBr, $CHF_3$, $CH_2F_2$, $CH_3F$, $NH_3$, $CH_4$, and combinations thereof.

11. The method of claim 10, wherein said source of hydrogen is HBr, and wherein a source of carbon is present in a process chamber in which said plasma etching is carried out.

12. The method of claim 9, wherein said source of fluorine is selected from the group consisting of $CF_4$, $CHF_3$, $CH_2F_2$, $CH_3F$, and combinations thereof.

13. The method of claim 9 or claim 10, or claim 11, or claim 12, wherein said source of high energy species is selected from the group consisting of helium, nitrogen, argon, krypton, xenon, and combinations thereof.

14. The method of claim 9, wherein said source of hydrogen is HBr, said source of fluorine is $CF_4$, and said source of high energy species is argon.

15. A method for plasma etching a trench having a rounded bottom corner in a silicon substrate, the method comprising the following steps:
   a) providing a semiconductor structure comprising a patterned hard mask, with a silicon substrate beneath said hard mask;
   b) plasma etching an upper portion of a trench to a depth within the range of about 75% and about 95% of a desired final depth of said trench, wherein etching is performed using a first process chamber pressure; and c) plasma etching said trench to said desired final depth, wherein etching is performed using a second process chamber pressure which is at least about two times greater than said first process chamber pressure.

16. The method of claim 15, wherein said first process chamber pressure ranges from about 10 mTorr to about 50 mTorr.

17. The method of claim 16, wherein said second chamber pressure ranges from about 50 mTorr to about 100 mTorr.

18. The method of claim 15, wherein said upper portion of said trench etched in step (b) is etched to a depth within the range of about 80% to about 90% of said desired final depth.

19. The method of claim 15, wherein said plasma etching in step b) is carried out using a plasma generated from a feed gas comprising chlorine or oxygen, or a combination thereof.

20. The method of claim 19, wherein said plasma feed gas also includes $SF_6$.

21. The method of claim 15, wherein said plasma is a high density plasma having an electron density ranging from about $10^9$ to $10^{12}$ $e^{-/cm3}$.

22. The method of claim 15, or claim 16, or claim 17, or claim 21, wherein said plasma etching is performed in sequence in a single processing chamber.

23. A method for plasma etching of a trench having a rounded top corner and a rounded bottom corner in a silicon substrate, the method comprising the following steps:

a) providing a semiconductor structure comprising residue from an organic photoresist, and a silicon oxide layer overlying a silicon substrate;

b) plasma etching at least a portion of said organic photoresist residue, through said silicon oxide layer, and into an upper portion of said silicon substrate using active species generated from a feed gas comprising carbon and fluorine;

c) plasma etching a trench into said silicon substrate using a two-step process comprising:

i) plasma etching an upper portion of said trench to a depth within the range of about 75% and about 95% of a desired final depth of said trench, wherein etching is performed using a first process chamber pressure within the range of about 10 mTorr to about 50 mTorr; and ii) plasma etching said trench to said desired final depth, wherein etching is performed using a second process chamber pressure within the range of about 50 mTorr to about 100 mTorr.

24. A method for plasma etching a trench having a rounded top corner and a rounded bottom corner in a silicon substrate, the method comprising the following steps:

a) providing a semiconductor structure comprising a patterned hard mask, and a silicon oxide layer overlying a silicon substrate;

b) plasma etching through said silicon oxide layer, while forming an extension on a sidewall of said patterned hard mask, using reactive species generated from a feed gas comprising a source of fluorine, a source of carbon, a source of hydrogen, and a source of high energy species which provide physical bombardment of native oxide surfaces;

c) plasma etching a trench into said silicon substrate using a two-step process comprising:

i) plasma etching an upper portion of said trench to a depth within the range of about 75% and about 95% of a desired final depth of said trench, wherein etching is performed using a first process chamber pressure within the range of about 10 mTorr to about 50 mTorr; and ii) plasma etching said trench to said desired final depth, wherein etching is performed using a second process chamber pressure within the range of about 50 mTorr to about 100 mTorr.

25. The method of claim 1, or claim 9, or claim 15, or claim 23, or claim 24, wherein said method is carried out in an apparatus which provides for separate control of the power provided to the plasma generation source and of the power provided to a substrate bias.

26. The method of claim 25, wherein steps b) and c) are performed in a single processing chamber.

27. An apparatus, comprising:

(a) a memory that stores instructions for:

plasma etching a trench having a rounded top corner in a silicon substrate, wherein the plasma etching process comprises the following steps:

i) providing a semiconductor structure comprising residue from an organic photoresist, and a silicon oxide layer overlying a silicon substrate;

ii) plasma etching at least a portion of said organic photoresist residue, through said silicon oxide layer, and into an upper portion of said silicon substrate using active species generated from a feed gas comprising carbon and fluorine;

iii) plasma etching a trench into said silicon substrate using active species generated from a feed gas different from that used in step ii);

(b) a processor adapted to communicate with the memory and to execute the instructions stored by the memory;

(c) an etch chamber adapted to expose the substrate to the etchant in accordance with instructions from the processor; and (d) a port adapted to pass communications between the processor and the etch chamber.

28. An apparatus, comprising:

(a) a memory that stores instructions for:

plasma etching a trench having a rounded top corner in a silicon substrate, wherein the plasma etching process comprises the following steps:

i) providing a semiconductor structure comprising a patterned hard mask, and a silicon oxide layer overlying a silicon substrate;

ii) plasma etching through said silicon oxide layer, while forming an extension on a sidewall of said patterned hard mask, using reactive species generated from a feed gas comprising a source of fluorine, a source of carbon, a source of hydrogen, and a source of high energy species which provide physical bombardment of native oxide surfaces;

iii) plasma etching a trench into said silicon substrate using active species generated from a feed gas different from that used in step ii);

(b) a processor adapted to communicate with the memory and to execute the instructions stored by the memory;

(c) an etch chamber adapted to expose the substrate to the etchant in accordance with instructions from the processor; and (d) a port adapted to pass communications between the processor and the etch chamber.

29. An apparatus, comprising:

(a) a memory that stores instructions for:

plasma etching a trench having a rounded bottom corner in a silicon substrate, the method comprising the following steps:

i) providing a semiconductor structure comprising a patterned hard mask, with a silicon substrate beneath said hard mask;

ii) plasma etching an upper portion of a trench to a depth within the range of about 75% and about 95% of a desired final depth of said trench, wherein etching is performed using a first process chamber pressure; and iii) plasma etching said trench to said desired final depth, wherein etching is performed using a second process chamber pressure which is at least about two times greater than said first process chamber pressure;

(b) a processor adapted to communicate with the memory and to execute the instructions stored by the memory;

(c) an etch chamber adapted to expose the substrate to the etchant in accordance with instructions from the processor; and (d) a port adapted to pass communications between the processor and the etch chamber.

30. An article of manufacture comprising:

a recordable medium having recorded thereon a plurality of programming instructions for use to program an apparatus which controls an etch process to proceed by the method of claim 1 or claim 9.

31. An article of manufacture comprising:

a recordable medium having recorded thereon a plurality of programming instructions for use to program an apparatus which controls an etch process to proceed by the method of claim 15.

32. An article of manufacture comprising:

a recordable medium having recorded thereon a plurality of programming instructions for use to program an apparatus which controls an etch process to proceed by the method of claim 15.

* * * * *